(12) United States Patent
Chen et al.

(10) Patent No.: US 7,932,586 B2
(45) Date of Patent: Apr. 26, 2011

(54) LEADFRAME ON HEAT SINK (LOHS) SEMICONDUCTOR PACKAGES AND FABRICATION METHODS THEREOF

(75) Inventors: Nan-Jang Chen, Hsinchu (TW); Hong-Chin Lin, Taichung (TW)

(73) Assignee: Mediatek Inc., Hsin-Chu (TW)

( * ) Notice: Subject to any disclaimer, the term of this patent is extended or adjusted under 35 U.S.C. 154(b) by 133 days.

(21) Appl. No.: 11/949,800

(22) Filed: Dec. 4, 2007

(65) Prior Publication Data
US 2008/0142937 A1 Jun. 19, 2008

Related U.S. Application Data

(60) Provisional application No. 60/870,445, filed on Dec. 18, 2006.

(51) Int. Cl.
*H01L 23/495* (2006.01)
(52) U.S. Cl. ........ 257/675; 257/666; 257/686; 257/706; 257/777
(58) Field of Classification Search .................. 257/675, 257/706, 777, 666, 686
See application file for complete search history.

(56) References Cited

U.S. PATENT DOCUMENTS

| | | | |
|---|---|---|---|
| 6,326,678 B1 | 12/2001 | Karnezos et al. | |
| 6,552,417 B2 | 4/2003 | Combs | |
| 6,603,072 B1 * | 8/2003 | Foster et al. | 174/536 |
| 6,724,071 B2 * | 4/2004 | Combs | 257/666 |
| 6,727,574 B2 * | 4/2004 | Tomimatsu | 257/666 |
| 7,023,076 B2 * | 4/2006 | Khiang | 257/678 |
| 7,482,679 B2 * | 1/2009 | Aripin et al. | 257/666 |
| 2005/0212078 A1 * | 9/2005 | Kwon et al. | 257/516 |
| 2006/0175715 A1 | 8/2006 | Hirose et al. | |
| 2007/0108582 A1 * | 5/2007 | Karnezos | 257/686 |
| 2008/0283978 A1 * | 11/2008 | Aripin et al. | 257/670 |

FOREIGN PATENT DOCUMENTS

| | | |
|---|---|---|
| CN | 1819187 | 8/2006 |
| TW | 249829 | 2/2006 |

OTHER PUBLICATIONS

English abstract of CN1819187.
"Cost-Effective Chip-on-Heat Sink Leadframe Package for 800-mb/s/Lead Applications" IEEE Transactions on Advanced Packaging, vol. 29, No. 2, pp. 364-371.
"Design and Evaluation of Chip on Heat Sink Quad Flat Package (COHS-QFP) for Consumer Electronics" iMAPS—Taiwan 2005 Technical Symposium, pp. 260-264, Jun. 24-25, 2005.

* cited by examiner

*Primary Examiner* — Long K Tran
(74) *Attorney, Agent, or Firm* — Thomas | Kayden

(57) ABSTRACT

The invention relates to leadframe semiconductor packages mounted on a heat-sink and fabrication thereof. A system in package (SiP) comprises a leadframe having extension leads, configured with divisional heat sinks serving as power and ground nets. A set of semiconductor dies is attached by adhesive on the central region of the lead frame. Pluralities of wire bonds electrically connect the set of semiconductor dies to the leadframe and to the divisional heat sinks respectively. An encapsulation encloses the leadframe, but leaves the extension leads and the divisional heat sink uncovered, exposing a heat dissipating surface.

9 Claims, 12 Drawing Sheets

LEADFRAME ON HEAT SINK (LOHS) SEMICONDUCTOR PACKAGES AND FABRICATION METHODS THEREOF

CROSS-REFERENCE TO RELATED APPLICATIONS

This application claims the benefit of U.S. Provisional Application No. 60/870,445 filed on Dec. 18, 2006, the entirety of which is incorporated herein by reference.

BACKGROUND OF THE INVENTION

1. Field of the Invention

The invention relates to semiconductor packages, and in particular, to leadframe semiconductor packages mounted on a heat-sink and fabrication thereof.

2. Description of the Related Art

Requirements for faster signal transmissions are being driven by consumer demand for electronic devices with greater bandwidth capacity. Two main semiconductor packaging challenges encountered with high-speed data transmissions are: 1) thermal problems due to greater power consumption requirements; and 2) electrical problems due to higher signal bandwidth. In order to solve signal and power integrity ($F_{3dB}=0.35/t_r$) and heat dissipation ($P=C_L \times f \times V_{DD}^2$) issues, semiconductor packaging with both lower parasitic effects and lower costs are required for high speed integrated circuit applications.

Conventional semiconductor quad flat packages (QFPs) are used for low cost applications. The low cost applications require improved power dissipation benefit from the use of drop-in heat sink (DHS), die pad heat sink (DPH), exposed drop-in heat sink (EDHS), or exposed pad low profile in QFP (E-PAD LQFP), respectively. However, letting the heat sink act as a ground plane or floating ground plane does not improve the electrical performance effectively.

FIGS. 1A-1D are cross sections of traditional quad flat packages with different heat sinks enhancing thermal performance. Referring to FIG. 1A, a drop-in heat sink quad flat package (DHS-QFP) 100a comprises a semiconductor die 110 attached on a die pad 125 with an adhesion 120 therebetween. The die pad 125 is mounted on a heat sink 130. The semiconductor die 110 electrically connects leads 150 through bonding wires 140. An encapsulation 160 encloses the semiconductor die 110, the die pad 125, the heat sink 130 and wire bonding between the semiconductor chip and leads.

Alternatively, the semiconductor die 110 can be directly mounted on the heat sink 130 with adhesion 120. The heat sink 130 can also serve as a die pad. Both ends of the heat sink 130 are connected to the lead 150 through the polyimide tape 135, as shown in the die pad heat sink quad flat pack (DPH-QFP) 100b in FIG. 1B. However, the problem, of this type designed is that electrical performance can not be improved with the heat sink acting as a floating plane.

Referring to FIG. 1C, a bottom surface 132 of the heat sink 130 can be exposed to the outer environment as an exposed drop-in heat sink quad flat pack (EHDS-QFP) 110c. The heat sink 130 can be integrated with the leadframe to meet low profile requirements as shown in an exposed pad low profile quad flat pack (E-PAD LQFP) 100d in FIG. 1D. E-PAD LQFPs are ideal for a wide range of devices, such as microprocessors, controllers, DSPs, high speed logic, FPGAs, PLDs, and ASICs. Applications include laptops, telecom devices, high end audio/video devices and CPU/GUI boards. Electrical performances can be improved with the bottom surfaces of the heat sink acting as a ground plane.

U.S. Pat. Nos. 6,326,678 and 6,552,417, the entirety of which is hereby incorporated by reference, disclose molded plastic packages with heat sinks and enhanced electrical performance. FIG. 2A is a cross section of a conventional EDHS-QFP package. As shown in FIG. 2A, a semiconductor die 211 is attached by a film of thermally conductive epoxy 210 to a thick copper heat sink 201. An annular ceramic ring 206 is attached by a dielectric adhesive 213 onto the heat sink 201 on one surface of a ceramic ring 206 and onto a lead frame 205 on an opposite surface of the ceramic ring 206. Package 200 forms a transmission line for each lead in the lead frame 205, with the heat sink 201 acting as a ground plane. In addition, lead frame 205 includes an interposer ring 208 which surrounds a semiconductor die 211 inside the window 212 of a ceramic ring 206. Interposer ring 208 is separated into four sections 208a-208d to allow independent connections to the power and ground terminals.

FIG. 2B is a 3D view of package 200 with the plastic molding 204 removed to clearly show the lead frame 205 and the interposer ring 208. The interposer ring sections 208a-208d are attached to the heat sink 201 with dielectric adhesive 213. Interposer ring sections 208a-208d are further supported by tie bars 241a-241d, which are embedded in plastic molding 204. Lead frame 205 is severed to provide electrically isolated leads 250. Each of the interposer ring sections 208a-208d is wire bonded to one of the leads 250. Further, interposer ring sections 241b and 241d, which are dedicated for connections to a ground terminal, are electrically connected to heat sink 201 via electrically conductive epoxy 240. Alternatively, spot welding or other suitable mechanism can be used to electrically connect interposer ring sections 208b and 208d to heat sink 201. Interposer ring 208 is designed to surround semiconductor die 211 in close proximity without being in contact with semiconductor die 211. Consequently, very short wire bonds to both semiconductor die 211 and leads 250 are possible. Such wire bonds have low inductance, which, in turn, reduces the parasitic impedances of package 200, thereby enhancing package 200's electrical performance. Because the interposer ring sections are internal to package 200 and are accessed readily for connections, the number of leads on lead frame 205 required for power and ground connections is reduced, thereby effectively increasing the available lead count of package 200. However, the drawback of the semiconductor packages 200 is that lead inductance is very large thereby detrimental to power integrity.

Taiwan Patent No. 1249829, the entirety of which is hereby incorporated by reference, discloses leadframe based semiconductor packages and fabrication methods thereof. An embedded and/or exposed heat sink is disposed between the chip and the leads to promote electrical and thermal performance.

FIG. 3 is a cross section of a conventional chip-on heat sink leadframe package. Referring to FIG. 3, a chip on heat sink, COHS-LF package 300 includes a chip 330 attached with adhesive 342 on a leadframe 336 integrated with a heat sink 360 structure. The leadframe 336 is defined with inner leads 362 and outer leads 364. Dielectric layer 344 is interposed between the leadframe 336 and the heat sink 360. Bond pads 332 of the chip 330 are electrically connected to the inner leads 362 through the bonding wires 334. An encapsulation 338 encloses the chip 330, the heat sink 360 and wire bonding 334 between the chip and inner leads 362. After the heat sink 360 is attached to the front side of a chip 330, the leadframe package is grounded to improve heat dissipation and to control impedance of the leads. The drawback of the COHS-LF package 300 is that it is not compatible to a standard leadframe packaging processes and the heat sink only acts as a ground net.

Thus, a novel semiconductor packing processes is desired, which is capable of fulfilling both high performance and low production costs for applications related to high speed product integration requirements such as using the system in package (SiP) to integrate RF+BB chips or DTV+DDR SDRAMs.

BRIEF SUMMARY OF THE INVENTION

A detailed description is given in the following embodiments with reference to the accompanying drawings.

The invention relates to integration of leadframe on heat sink (LOHS) with multi-chips (system) mounted in a package (SiP). Meanwhile, the heat sink can be pre-divided into several PWR and GND regions to reduce number of leads further shrinking package dimensions An embodiment of the invention provides a system in package, comprising: a leadframe having extension leads, configured with divisional heat sinks serving as power and ground nets; a set of semiconductor dies attached by adhesive on the central region of the lead frame; a plurality of wire bonds electrically connecting the set of semiconductor dies to the leadframe and to the divisional heat sinks respectively; and an encapsulation layer enclosing the leadframe, but leaves the extension leads and the divisional heat sink uncovered, exposing a heat dissipating surface.

Another embodiment of the invention further provides an electronic system, comprising: a printed circuit board (PCB) with a plurality of different chips with different types of semiconductor packaging and electronic devices mounted thereon; a system in package (SiP) attached on the PCB with solders, wherein the system in package is operatically synergized with the plurality of different chips with different types of semiconductor packaging and electronic devices. The system in package (SiP) comprises a leadframe having extension leads, configured with divisional heat sinks serving as power and ground nets; a set of semiconductor dies attached by adhesive on the central region of the lead frame; a plurality of wire bonds electrically connecting the set of semiconductor dies to the leadframe and to the divisional heat sinks respectively; and an encapsulation layer enclosing the leadframe, but leaving the extension leads and the divisional heat sink uncovered, exposing a heat dissipating surface.

Another embodiment of the invention further provides a fabrication method for a system in package, comprising: assembling a leadframe having extension leads, configured with divisional heat sinks; attaching a set of semiconductor dies by adhesive on the central region of the lead frame; bonding wires connecting the set of semiconductor dies to the leadframe and to the divisional heat sinks respectively; and molding an encapsulation layer enclosing the leadframe, but leaving the extension leads and the divisional heat sink uncovered, exposing a heat dissipating surface.

Note that assembling of the leadframe comprises providing a top metal, a dielectric material and a bottom metal; pressing an assembly of the top metal, a dielectric material and a bottom metal; etching the top metal to create a leadframe with extension leads and an opening at a central region thereof; etching bottom metal to create divisional heat sinks; forming through holes proliferating the assembly; removing the dielectric material within the opening; forming a solder mask at the peripheral region of the leadframe; and electroplating a metal on the wirebonding area.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
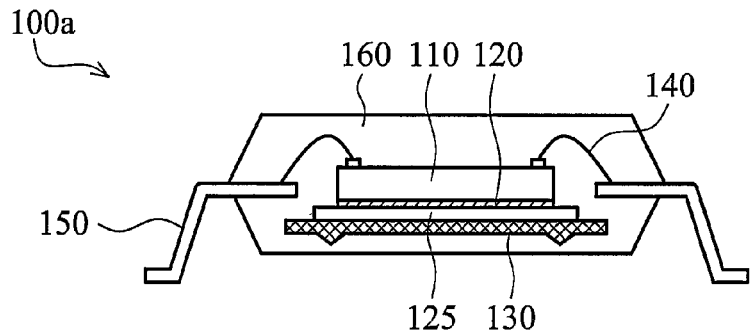
FIGS. 1A-1D are cross sections of a traditional quad flat packages with different heat sinks enhancing thermal performance.
Figure 1B:
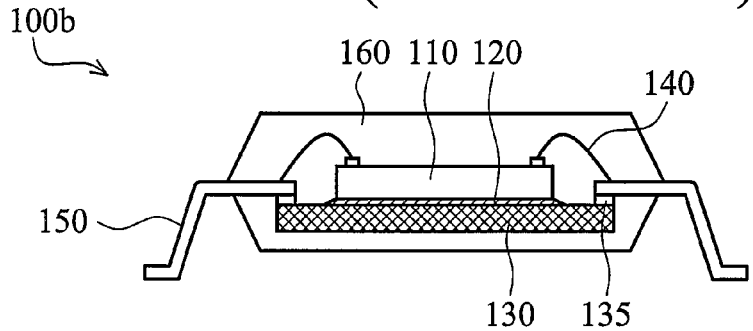
Figure 1C:
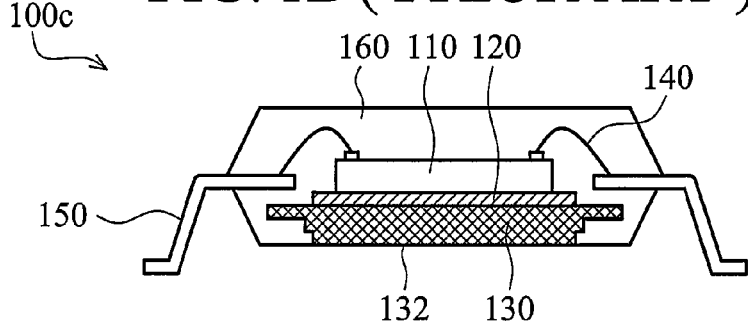
Figure 1D:
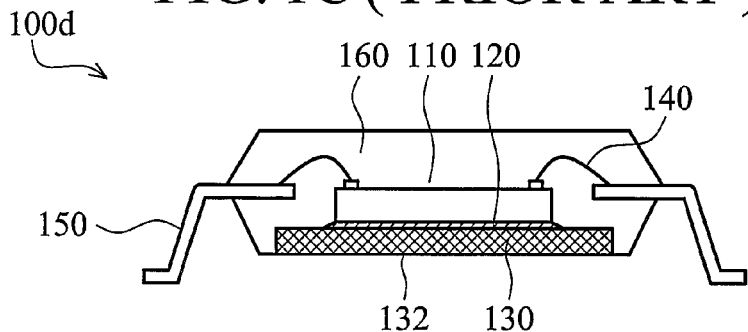
Figure 2A:
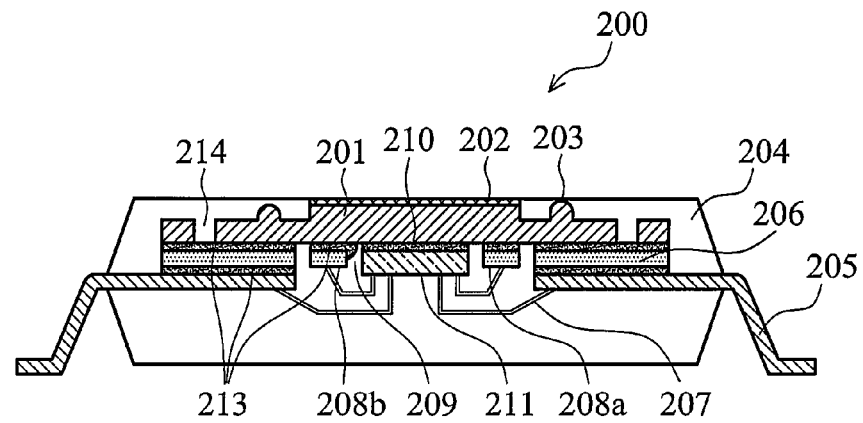
FIG. 2A is a cross sectional view of a conventional EDHS-QFP package.
Figure 2B:
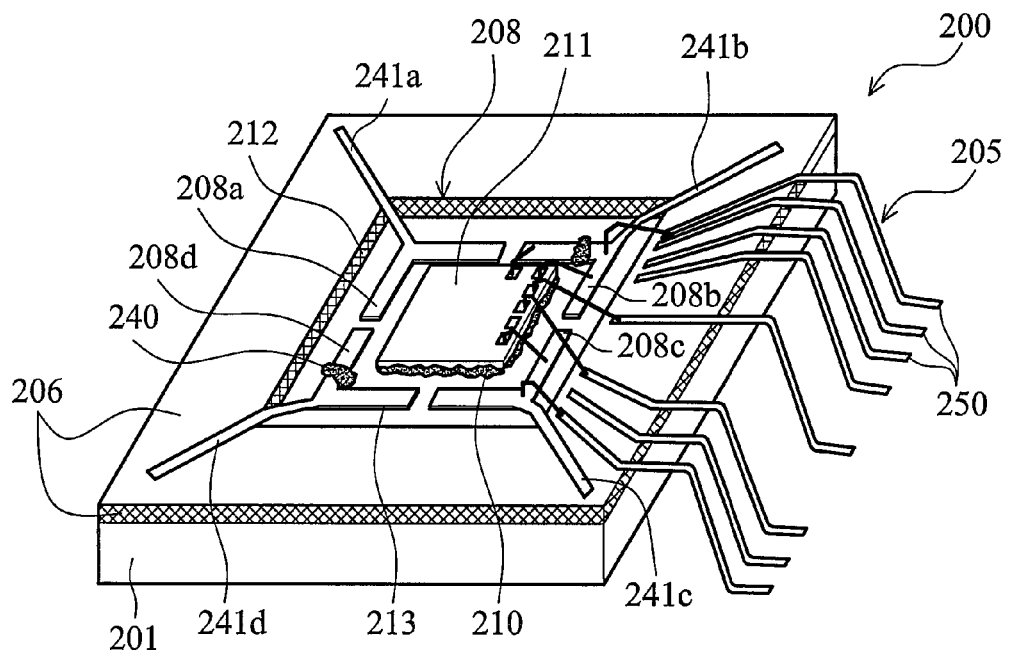
FIG. 2B is a 3D view of a conventional LOHS-QFP package with plastic molding removed to clearly show the lead frame and the interposer ring.
Figure 3:
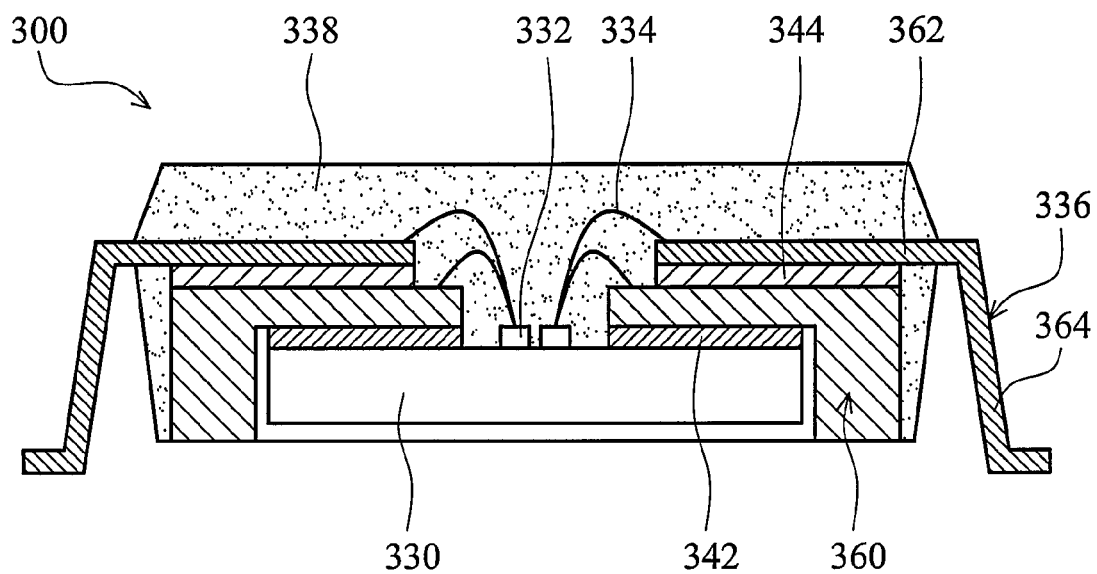
FIG. 3 is a cross section of a conventional chip-on heat sink leadframe package.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Figure 4A:
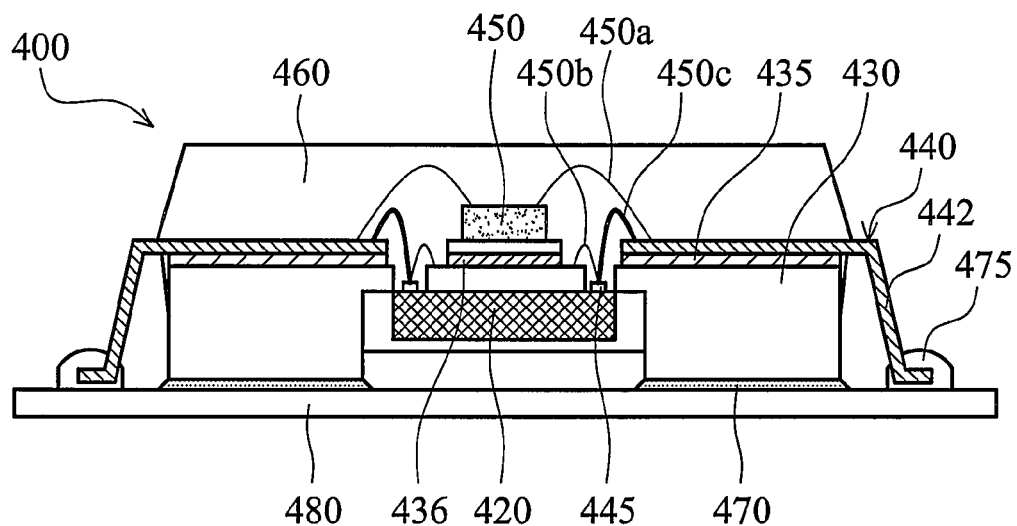
FIG. 4A is a cross section of an embodiment of a lead on heat sink (LOHS) system in package (SiP) of the invention.
Figure 4B:
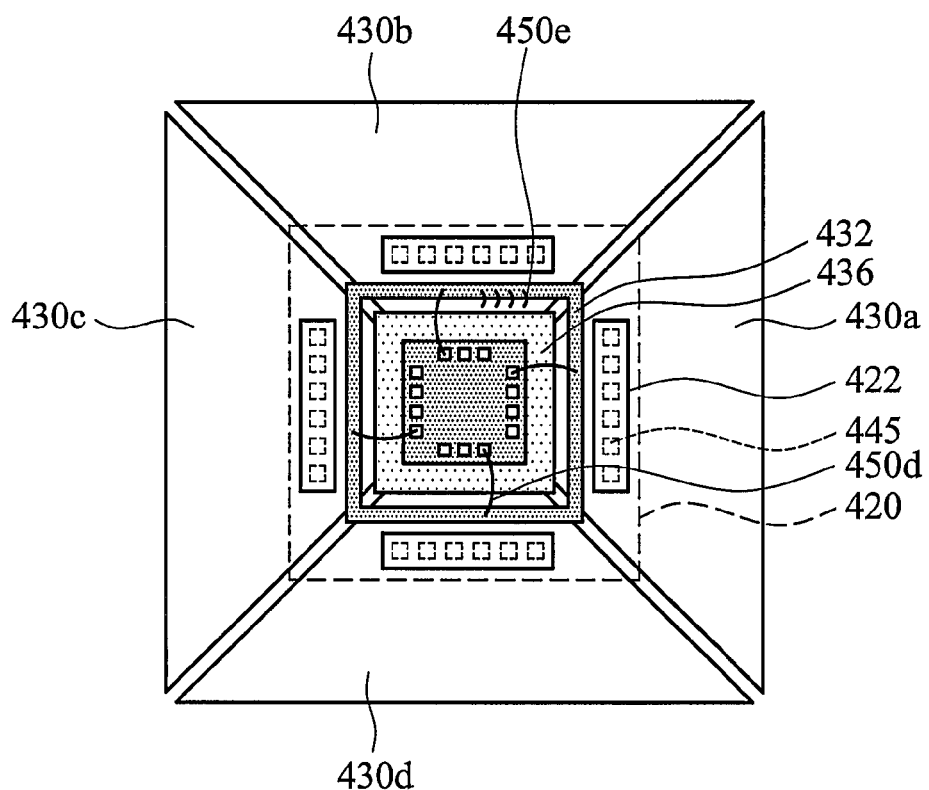
FIG. 4B is a plan view of the LOHS-SiP of FIG. 4A.

FIG. 4A is a cross section of an embodiment of a lead on heat sink (LOHS) system in package (SiP) of the invention. FIG. 4B is a plan view of the LOHS-SiP of FIG. 4A. A lead on heat sink system in package (LOHS-SiP) 400 includes a leadframe 440 having extension leads 442, configured with divisional heat sinks 430a-430d serving as power and ground nets. A dielectric layer 435 is interposed between the leadframe 440 and the divisional heat sinks 430. Semiconductor dies 420 and 450 are attached by adhesive on the central region of the lead frame. Semiconductor dies 420 and 450 are a set of vertically stacked pair of dies including a digital chip and an analog chip, an RF chip and a BB chip, or a DSP chip and a DDR SDRAM chip. A plurality of wire bonds 450a-450d are electrically connected to the semiconductor dies 420 and 450 to the leadframe and to the divisional heat sinks respectively. An encapsulation 460 encloses the leadframe 440, leaving the extension leads 442 and the divisional heat sink uncovered, exposing a heat dissipating surface.

The LOHS-SiP 400 further comprises an interconnection section 432 as a bridge electrically connecting the set of semiconductor dies and the divisional heat sinks by wire bonds. A die paddle 436 is optionally disposed on the central region of the lead frame 440 for supporting the set of semiconductor dies 420 and 450. The LOHS-SiP 400 is mounted on a printed circuit board (PCB) 480 with solders 470 and 475.

The leadframe and the heat sink are fabricated by compatible semiconductor processes, and then bonded with the stacked chips. The added heat sink not only improves heat removal, but also creates several power and ground planes. For example, the heat sink can be pre-divided into several PWR/GND regions to reduce number of leads further shrinking package dimensions. Since the number of the leads can be thus reduced, better signal integrity and power integrity with fine lead pitch can also be achieved. Furthermore, the power and ground planes are bonded to the corresponding power and ground pads on the die and then soldered to the power and ground nets on the printed circuit board (PCB). Since power and ground do not need to go through the leads on the COHS-LF package, there is more space available to design the lead geometry for high-speed application, and therefore increased opportunity to reduce the package size.

Figure 5A:
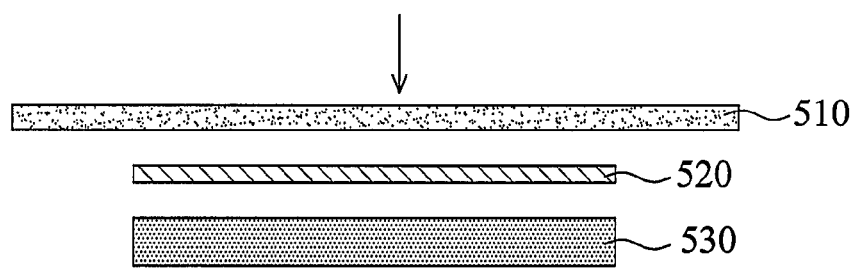
FIGS. 5A-5H are cross sections of each fabrication step of an embodiment of an LOHS structure of the invention.
Figure 5B:
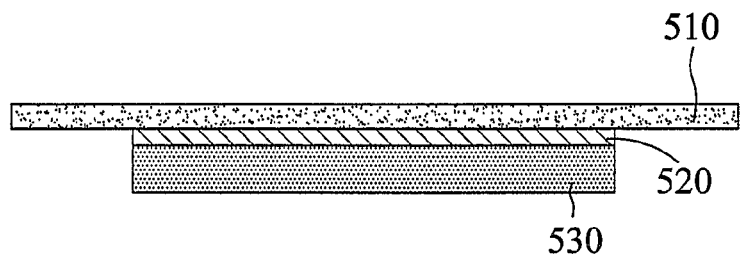

FIGS. 5A-5H are cross sections of each fabrication step of an embodiment of an LOHS structure of the invention. Referring to FIG. 5A, a top metal layer 510, a dielectric material layer 520 and a bottom metal layer 530 are provided. The top and bottom metal layers can be metals (such as Cu and Al) and alloys (such as C7025, A42, and A192). The dielectric material layer can be FR-4, BT, ceramic, epoxy prepeg (PP), polyimide tape, and adhesive film. The top metal layer 510, the dielectric material layer 520 and the bottom metal layer are pressed into an assembly, as shown in FIG. 5B.

Figure 5C:
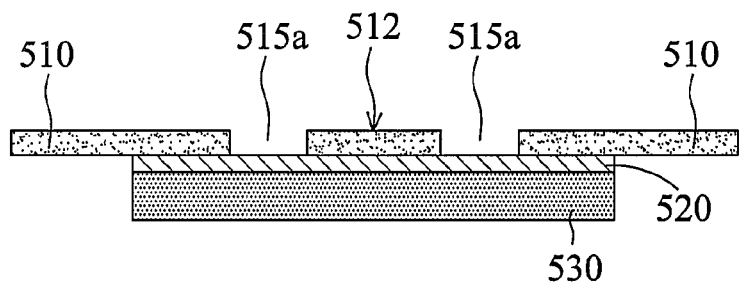
Figure 5D:
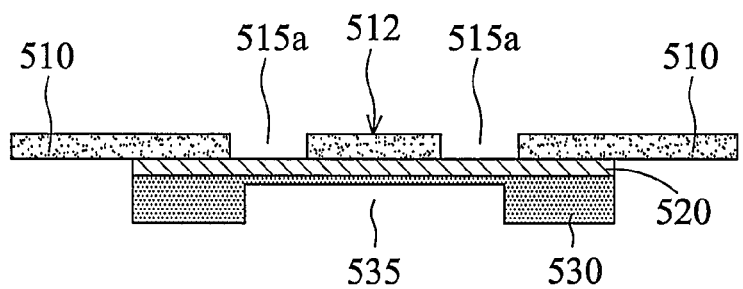

Referring to FIG. 5C, the top metal layer 510 is etched to create a leadframe with extension leads and openings 515a and an elevated central region as a die paddle 512. The bottom metal layer is then etched to create a concave region 535 for die attachment and divisional heat sinks as PWR/GND nets, as shown in FIG. 5D.

Figure 5E:
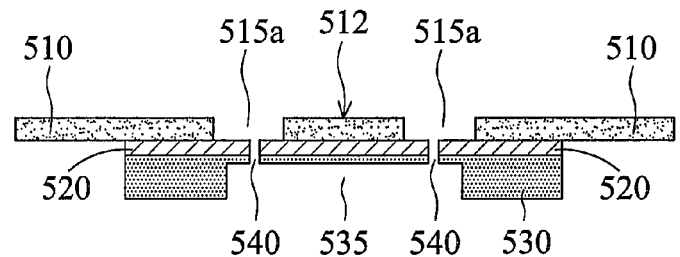
Figure 5F:
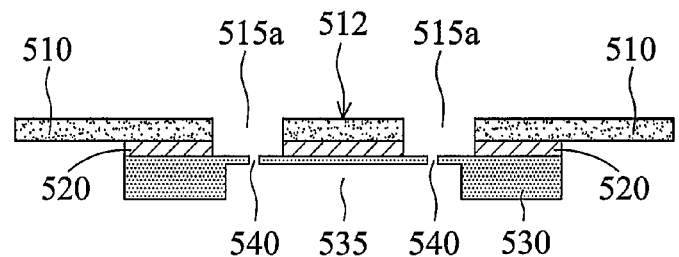

Referring to FIG. 5E, through holes 540 are proliferated through the assembly serving as chip openings for subsequently wire bonding. The exposed dielectric material layer within the openings 515a is then removed using the top metal layer as a mask, as shown in FIG. 5F.

Figure 5G:
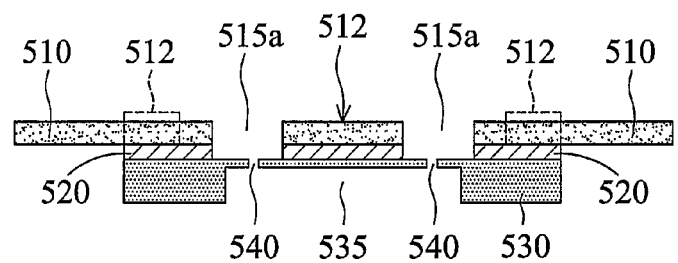
Figure 5H:
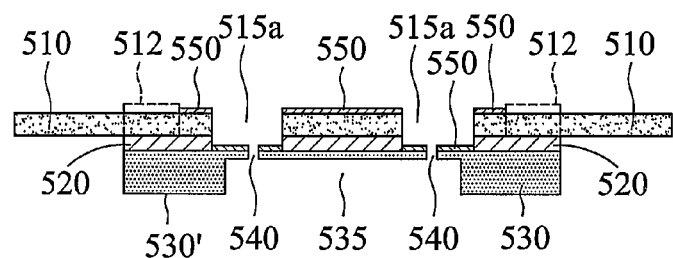

Referring to FIG. 5G, a solder mask 512 is applied covering the subsequently undesired electroplating regions. A conventional dam bar on the leadfame can be simultaneously omitted due to formation of the solder mask 512 at the peripheral region of the leadframe. A metal layer 550 is then electroplated on the top metal layer, as shown in FIG. 5H. Materials for the metal layer 550 can be a single Au, Ag, Ni, Cu, or Pd layer, or different metal laminated electroplating to enhance adhesion between the bondwires and the leads.

Figure 6A:
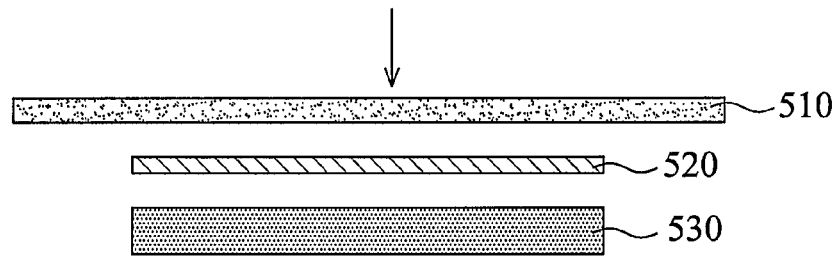
FIGS. 6A-6H are cross sections of each fabrication step of another embodiment of an LOHS structure of the invention.
Figure 6B:
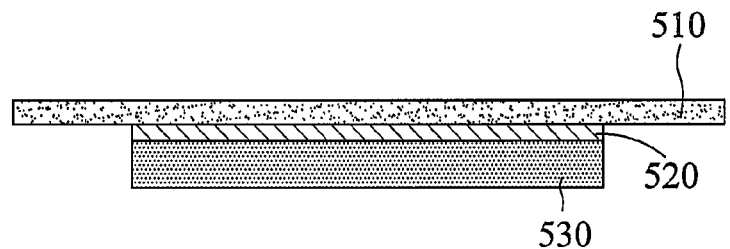
Figure 6C:
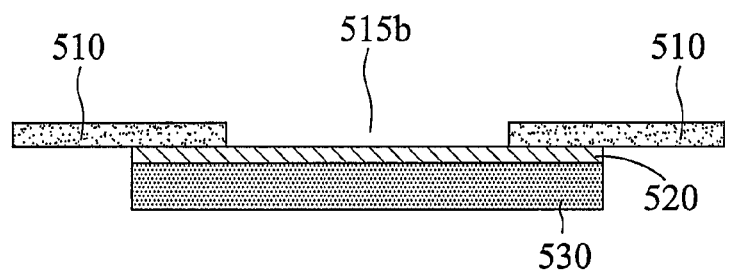
Figure 6D:
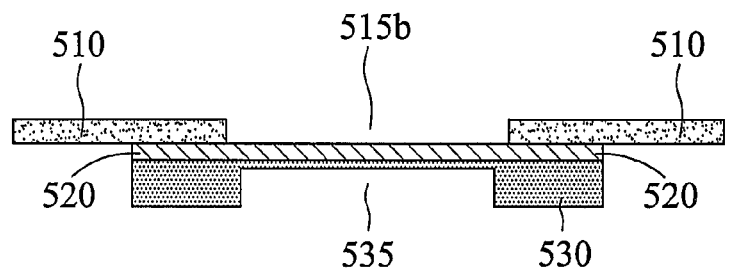
Figure 6E:
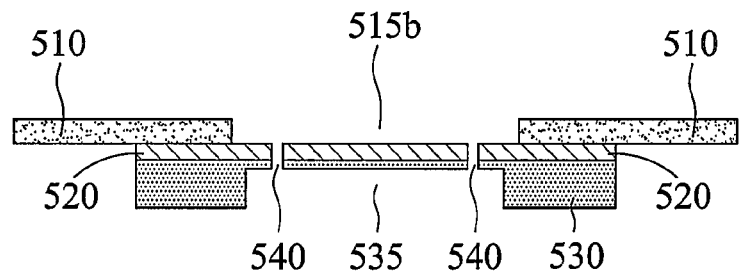
Figure 6F:
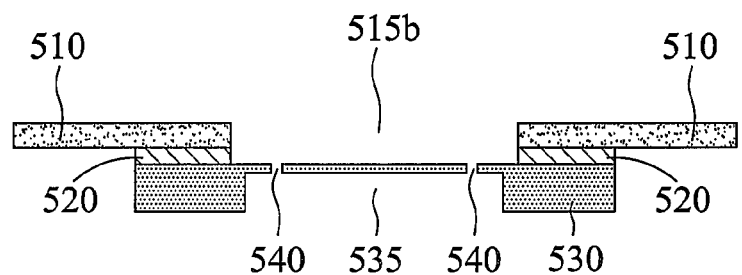
Figure 6G:
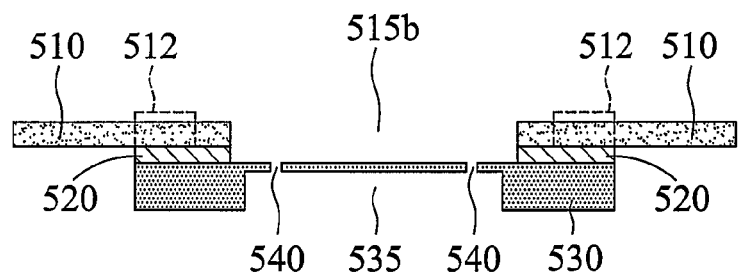
Figure 6H:
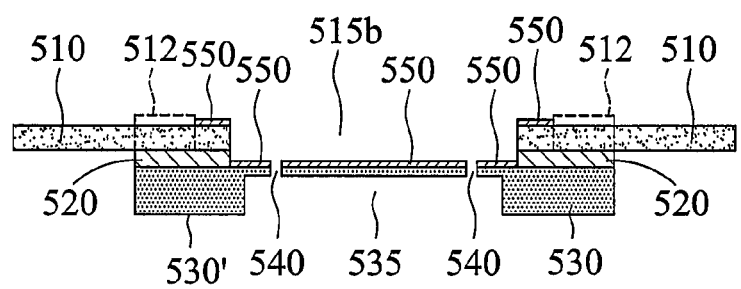

FIGS. 6A-6H are cross sections of each fabrication step of another embodiment of an LOHS structure of the invention. Elements of the LOHS structure of FIGS. 6A-6H are substantially similar to those in FIGS. 5A-5H, with the similar steps omitted herein. The difference therebetween is that the central die paddle is removed after the top metal layer is etched as shown in FIG. 6C. A central opening 515b is created, and stacked dies can be attached on both sides of the heat sink. Note that if said heat sink is pre-divided into several PWR/ GND regions, shapes, and through holes before pressing assembly in FIG. 5B, the subsequent steps in FIGS. 5D-5E can be omitted.

Since the abovementioned LOHS structures include a solder mask, the contact region with injection mold is flat. As such, the dam bar design is unnecessary, thus subsequent conventional deflash/trim or dejunk/trimming steps are omitted.

Figure 7:
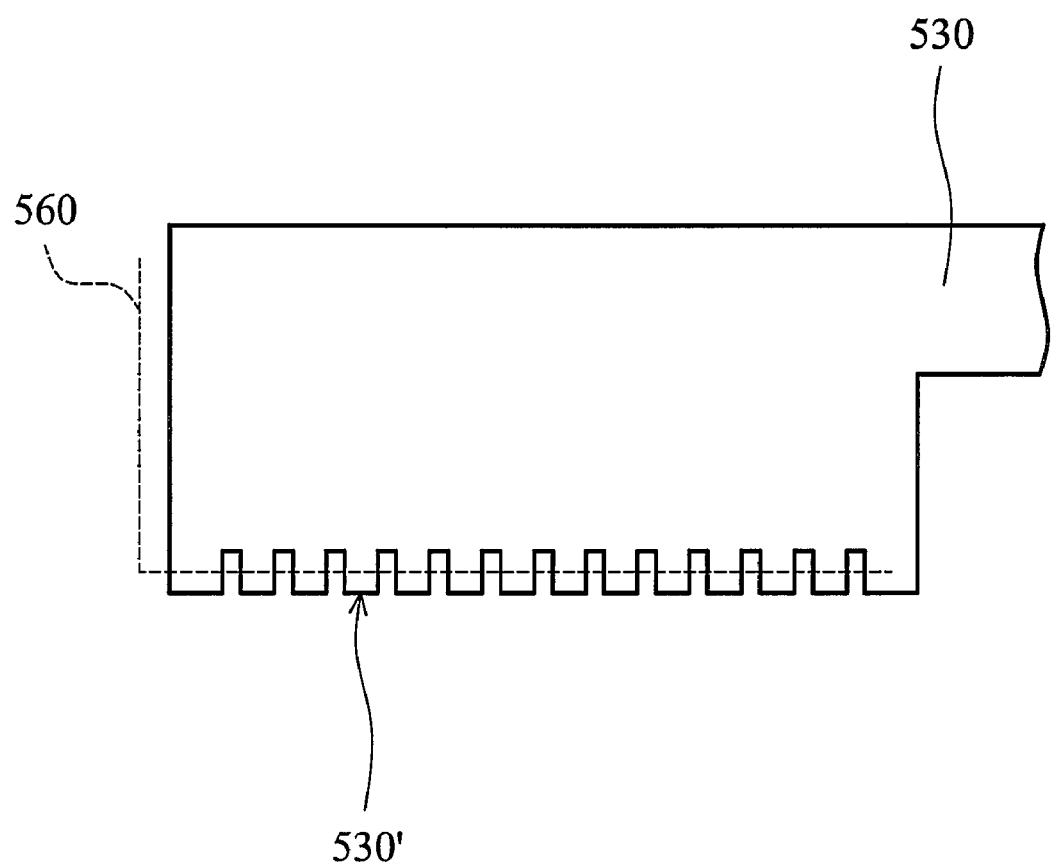
FIG. 7 is a schematic view of an enlargement of the exposed surface of the heat sink of some embodiments of the invention.

FIG. 7 is a schematic view of an enlargement of the exposed surface of the heat sink of some embodiments of the invention. An encapsulation 560 is subsequently molded exposing a heat dissipating surface 530' of the divisional heat sinks 530. The heat dissipating surface 530' of the divisional heat sinks comprises a plurality of protrusions or bumps to improve adhesion between resin and the divisional heat sinks. Since the exposed heat dissipating surface 530' includes small trenches, thermal stress due to coefficient of thermal expansion (CTE) can be ameliorated.

Figure 8:
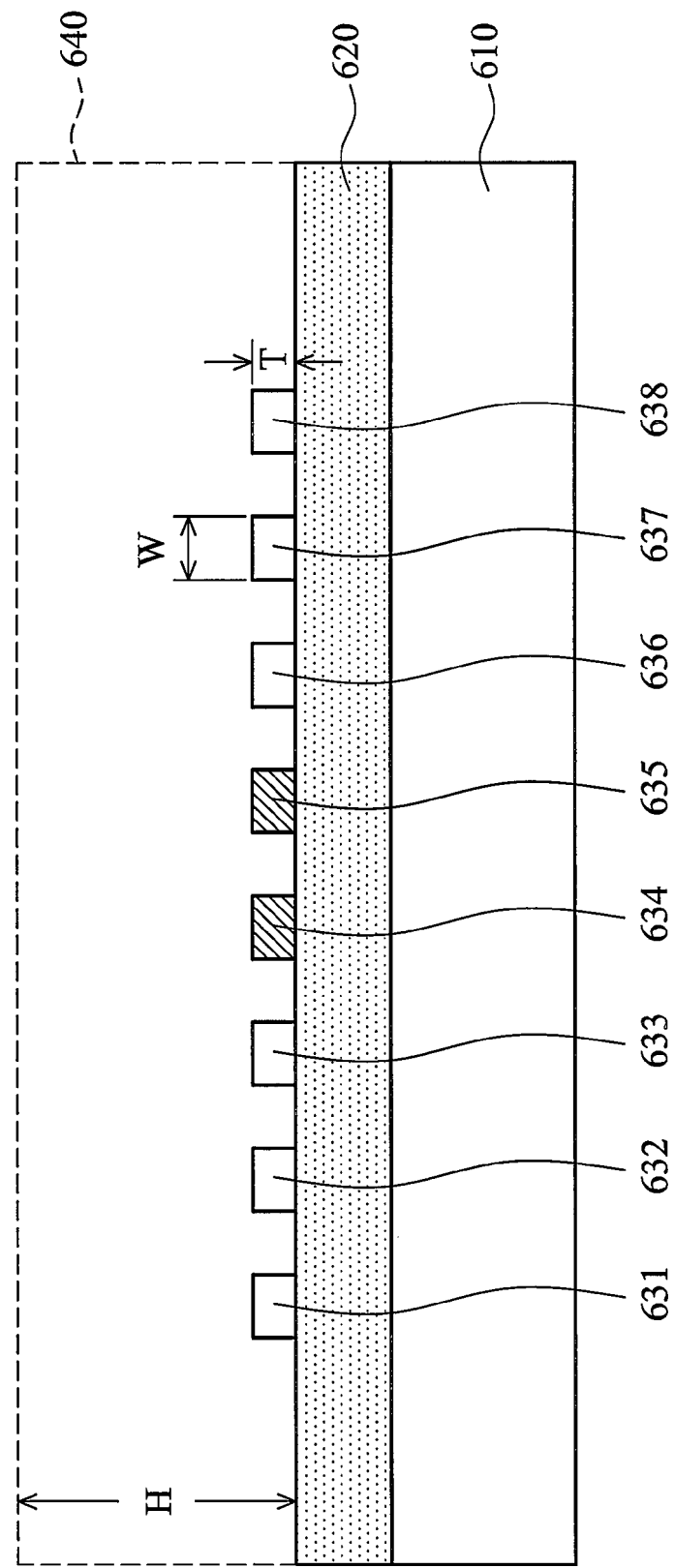
FIG. 8 is a schematic model showing the system in package and lead geometry, as well as materials used.

The ground divisional heat sinks beneath the leads allow for controlling of impedance. FIG. 8 is a schematic model showing the system in package and lead geometry, as well as materials used. A leadframe having extension leads 631-638 is configured with divisional heat sinks 610 serving as power and ground nets. A dielectric layer 620 is interposed between the leadframe and the divisional heat sinks. An encapsulation 640 pacifies and covers the package. Adjust the lead geometries and the dielectric thickness 620 and 640, the target leads 634 and 635 can be designed as required impedance, such as 50Ω single-ended or 100Ω differential impedance, for better signal integrity.

Heat flows (Th) from the higher temperature chip to the lower temperature ambient outer environment. Therefore, a higher thermal conductivity (κ) between chip and ambient enhances heat removal (e.g., copper κ≈400 W/mK). Thermal and electrical analysis of the package with chip surface attached to the exposed heat sink showed it had even smaller temperature increment, less signal losses and cross-talk than the conventional BGA package and LOC-TSOP packages.

Figure 9:
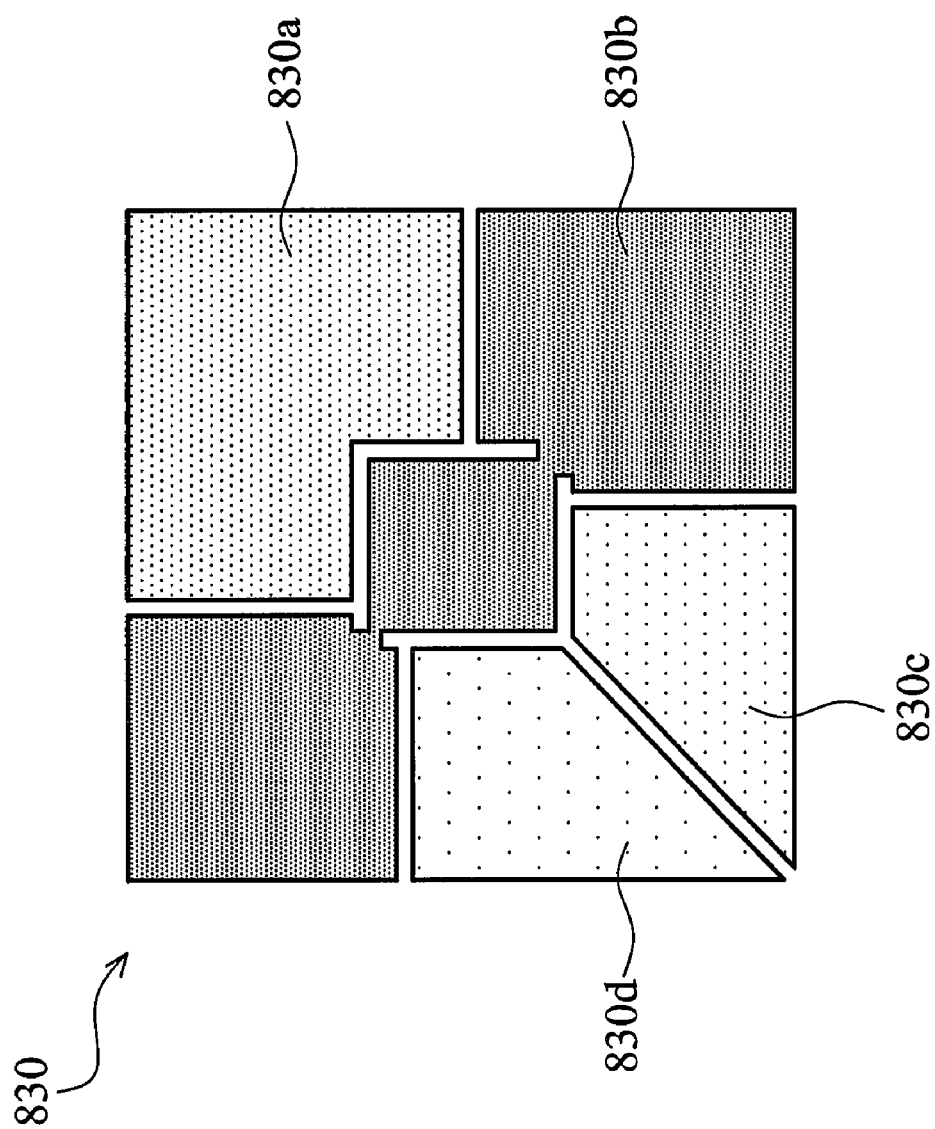
FIG. 9 depicts the heat sink divided into several power and ground nets.

FIG. 9 is a plan view of embodiment for the heat sink 830 divided into several power and ground nets 830a-830d. Due to shorter bondwires and larger power and ground nets compared to traditional QFPs, lower parasitic parameters from the LOHS-QFP are expected.

Figure 10A:
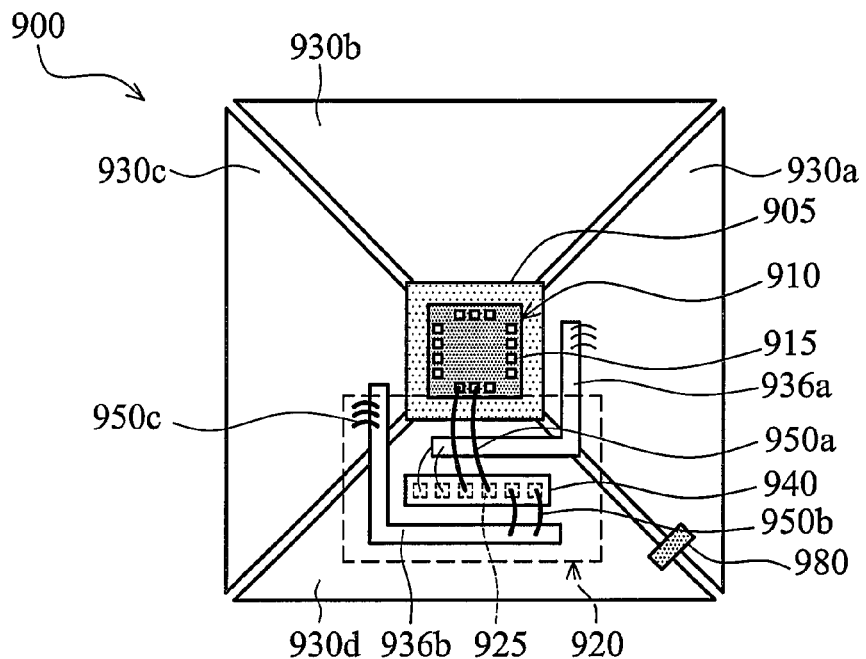
FIG. 10A is a plan view of another embodiment of a lead on heat sink system in package (LOHS-SiP) of the invention.

FIG. 10A is a plan view of another embodiment of a lead on heat sink system in package (LOHS-SiP) of the invention. A LOHS-SiP 900 includes a multi-chip stacked application. The drawback of the conventional DSP+DDR SDRAM chip stacks include lengthy wires due to the bonding pads being disposed at the center of the DDR SDRAM, resulting in wire sweep problems, deteriorated electrical performances and production yields.

Referring to FIG. 10A, an LOHS-SiP 900 includes divisional heat sinks 930a-930d pasted with a top die (DSP chip) 910 and a bottom die (SDRAM chip) 920 embedded therein. The heat sink 930 contains an opening 940 around the chip-bonding pads 925, and thus shorter bondwires 950a and 950b are obtained. The bottom die 920 interconnects a top die 910 through the wire bonding 950a via a proper opening 940 of the heat sink. Thus, the lengths of the bondwires 950a are shorter with better electrical performance and termination can be omitted. Some passive devices 980 such as capacitors or inductors are disposed on the peripheral regions between adjacent divisional heat sinks. Furthermore, with the die peddle 905 able to serve as a buffer between dies 910 and 920, packaging yield can be increased. Meanwhile, because the top metal can be etched into interconnected sections 936a and 936b, the length of the bondwires 950b and 950c can be further reduced.

Figure 10B:
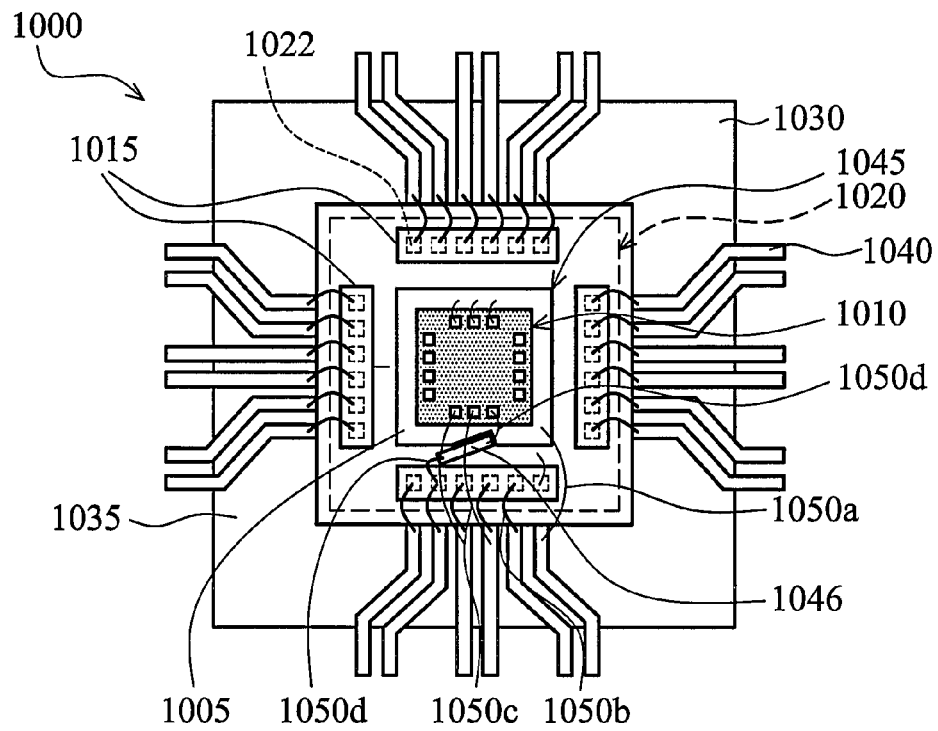
FIG. 10B is a plan view of yet another embodiment of LOHS-SiP with RF+Baseband chip stacks of the invention.

FIG. 10B is a plan view of yet another embodiment of LOHS-SiP with RF+Baseband chip stacks of the invention. An LOHS-SiP 1000 with RF+Baseband chip stacks include divisional heat sinks 1030 pasted with a top die (RF chip) 1010 and a bottom die (BB chip) 1020 embedded therein. The heat sink 1030 contains opening 1015 around the chip-bonding pads 1022, and thus shorter bondwire 1050b are obtained. The bottom die 1020 interconnects a top die 1010 through bondwires 1050d via an interconnection section 1046 or a common bar. Thus, the crossover of wirebonding can be avoided. With the die peddle 1045 able to serve as a buffer between dies 1010 and 1020, packaging yield can be increased. Furthermore, the die peddle 1045 can effectively block RF signal interference.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system in package, comprising:
    a leadframe having extension leads, configured with divisional heat sinks serving as power and ground nets;
    a set of semiconductor dies, attached by adhesive on the central region of the lead frame;
    a die paddle disposed on the central region of the leadframe and interposed between the set of semiconductor dies for supporting the set of semiconductor dies;
    a plurality of wire bonds electrically connecting the set of semiconductor dies to the leadframe and to the divisional heat sinks respectively; and
    an encapsulation enclosing the leadframe, but leaving the extension leads and the divisional heat sink uncovered, wherein the set of semiconductor dies comprise a top die pasts with the divisional heat sinks and a bottom die embedded in the divisional heat sinks, wherein the bottom die interconnects the top die via an opening of one of the divisional heat sinks.

2. The system in package as claimed in claim 1, wherein the set of semiconductor dies comprises a vertically stacked pair of semiconductor dies.

3. The system in package as claimed in claim 2, wherein the vertically stacked pair of semiconductor dies comprises a digital chip and an analog chip, a radio frequency (RF) chip and a base band (BB) chip, or a digital signal processor (DSP) chip and a memory chip.

4. The system in package as claimed in claim 1, further comprising an interconnection section as a bridge electrically connecting the set of semiconductor dies and the divisional heat sinks by wire bonds.

5. The system in package as claimed in claim 1, wherein the interconnection section is disposed crossing two adjacent divisional heat sinks.

6. The system in package as claimed in claim 1, wherein the heat dissipating surface of the divisional heat sinks comprises a plurality of protrusions or bumps.

7. The system in package as claimed in claim 1, further comprising a dielectric layer interposed between the leadframe and the divisional heat sinks.

8. The system in package as claimed in claim 1, further comprising passive devices on peripheral regions of the divisional heat sinks.

9. The system in package as claimed in claim 1, further comprising a die paddle on the central region of the lead frame for supporting the set of semiconductor dies.

* * * * *